United States Patent [19]
Gershon

[11] Patent Number: 4,859,968
[45] Date of Patent: Aug. 22, 1989

[54] FREQUENCY GENERATOR

[75] Inventor: Ezra Gershon, East Meadow, N.Y.

[73] Assignee: Integrated Technologies Solutions, Inc., East Meadow, N.Y.

[21] Appl. No.: 232,705

[22] Filed: Aug. 16, 1988

[51] Int. Cl.$^4$ .................. H03B 21/02; H03L 7/18
[52] U.S. Cl. ..................................... 331/38; 331/16; 331/40; 455/260
[58] Field of Search .................. 331/1 A, 2, 16, 18, 331/22, 25, 30, 31, 37, 38, 39, 40; 455/76, 87, 165, 183, 192, 196, 199, 257, 258, 259, 260

[56] References Cited

U.S. PATENT DOCUMENTS

| | | | |
|---|---|---|---|
| 3,982,199 | 9/1976 | Green | 331/51 |
| 4,458,329 | 7/1984 | Remy | 364/851 |
| 4,494,073 | 1/1985 | Sorgi | 328/14 |
| 4,558,282 | 12/1985 | Lowenschuss | 328/14 |
| 4,630,217 | 12/1986 | Smith et al. | 364/480 |
| 4,720,688 | 1/1988 | Hasegawa et al. | 331/2 |

OTHER PUBLICATIONS

*Frequency Synthesizers—Theory and Design;* Third Edition—Vadim Manassewitsch—pp. 1-37 and Preface; and Contents; John Wiley & Sons.

*Primary Examiner*—David Mis
*Attorney, Agent, or Firm*—Felfe & Lynch

[57] ABSTRACT

A frequency synthesizer system generates a clock signal having an adjustable, accurate and stable frequency. The synthesizer produces a first reference frequency FR and an adjustable first intermediate frequency F1 equal to the frequency FR divided by a selectable number (N2/N1) which permits course adjustment of the frequency in steps over a prescribed range. The frequencies FR and F1 are then mixed and filtered to produce a second intermediate frequency FR+F1. The system also generates a second reference frequency F3 which is finely adjustable over a range in the order of magnitude of the frequency difference between two successive steps of the first intermediate frequency F1. This second reference frequency is mixed with the second intermediate frequency and the result is filtered to produce a final frequency FR+F1+F3.

24 Claims, 3 Drawing Sheets

FREQUENCY GENERATOR

BACKGROUND OF THE INVENTION

The present invention relates to a frequency generator; that is, to a method and apparatus for generating a clock signal having an accurate and stable frequency which is adjustable, over a given range, in small (e.g. 0.05 Hz) programmable steps.

Many techniques are known for generating electrical signals with a prescribed frequency. The general theory of frequency generation is described in the text *Frequency Synthesizers: Theory and Design* by Vadim Manassewitsch, published by John Wiley & Sons. 1987. Specific circuits which represent the state of the art are disclosed in the U.S. Pat. Nos. 4,494,073; 4,603,217; 4,558,282; 4,458,329 and 3,982,199.

Traditionally, a clock signal with an accurate and stable frequency is derived from a crystal controlled oscillator. If only a single frequency is desired, this frequency may be obtained by choosing a relatively high oscillator frequency and then dividing this frequency by an integer number N. If a 50% duty cycle is desired, the frequency must be divided by an even number N.

If an adjustable frequency is desired, this technique is inconvenient. Even if the number N can be any integer, step changes in frequency due to increments in the number become smaller and smaller in a non-liner fashion as the number increases. That is:

$$\text{Step increment in frequency } S = \frac{F}{N} - \frac{F}{N+1} = \frac{F \times 1}{N(N+1)}$$

As may be readily seen from a plot of the step increment S against the dividing number N, the increment S is extremely non-linear for small values of N but approaches linearity with increasing values of N. In many applications, the original frequency F can be selected high enough such that, after dividing by the number N, the largest step increment S still provides the desired resolution in the frequency range of interest.

However, as this frequency range is expanded and must itself include relatively high frequencies, this technique of "dividing down" has proved inadequate.

To meet the requirements of the rapidly growing field of communications, a new family of approaches and techniques have emerged. The most commonly used techniques are those involving pulse stealing, fractional division, frequency mixing and the use of one or more phase locked loops. Such techniques are described in the aforementioned text *Frequency Synthesis: Theory and Design*. However, the pulse stealing and fractional division techniques result in frequency jitter around the stealing pulse frequency. With the phase locked loop technique, it is impossible to neglect the phase and filter noise on frequency accuracy and stability.

There is therefore a need to provide a frequency generator which produces an accurate, stable frequency which is adjustable in small, equal increments over a relatively large range of frequencies.

SUMMARY OF THE INVENTION

An object of the present invention, therefore, is to provide a method and apparatus for generating a clock signal having an adjustable, accurate and stable frequency.

A further object of the present invention is to provide a method and apparatus for generating a desired frequency which does not admit of the drawbacks of the frequency generators known in the art.

These objects, as well as other objects which will become apparent from the discussion that follows, are achieved, according to the present invention, by providing a system which includes both a binary division from an accurate, stable, reference frequency for course frequency selection and a voltage controlled crystal oscillator for fine frequency adjustment. The frequencies from the two frequency sources are mixed to provide an adjustable frequency output.

More particularly, the method according to the invention comprises the steps of:

(a) generating a clock signal with an accurate, stable, first reference frequency (FR);

(b) dividing said first reference frequency by a first, selectable number (N2/N1) to produce a clock signal with a first intermediate frequency (F1), the first intermediate frequency therefore being coarsely adjustable in steps over a prescribed range;

(c) mixing the clock signals having said first reference frequency and the first intermediate frequency to produce a clock signal having a second intermediate frequency (FR±F1);

(d) generating a clock signal with a second reference frequency (F3), the second reference frequency being finely adjustable over a range in the order of magnitude of the frequency difference between two successive steps of said first intermediate frequency;

(e) mixing the clock signals having the second intermediate frequency (FR±F1) and the second reference frequency (F3) to produce a clock signal having a third intermediate frequency (FR±F1±F3); and (f) dividing the third intermediate frequency by a selected second number (N3) to produce a clock signal with an adjustable final frequency (FY).

In order to increase the accuracy of the actual final frequency, this frequency may be compared with a desired frequency to determine the error in frequency and then the second reference frequency may be adjusted to reduce this error.

The foregoing as well as other objects features and advantages of the present invention will be apparent from the following, more particular description of the preferred embodiments of the invention, as illustrated in the accompanying drawings.

DESCRIPTION OF THE PREFERRED EMBODIMENT

The preferred embodiment of the present invention will now be described with reference to FIGS. 1-3 of the drawings.

Figure 1:
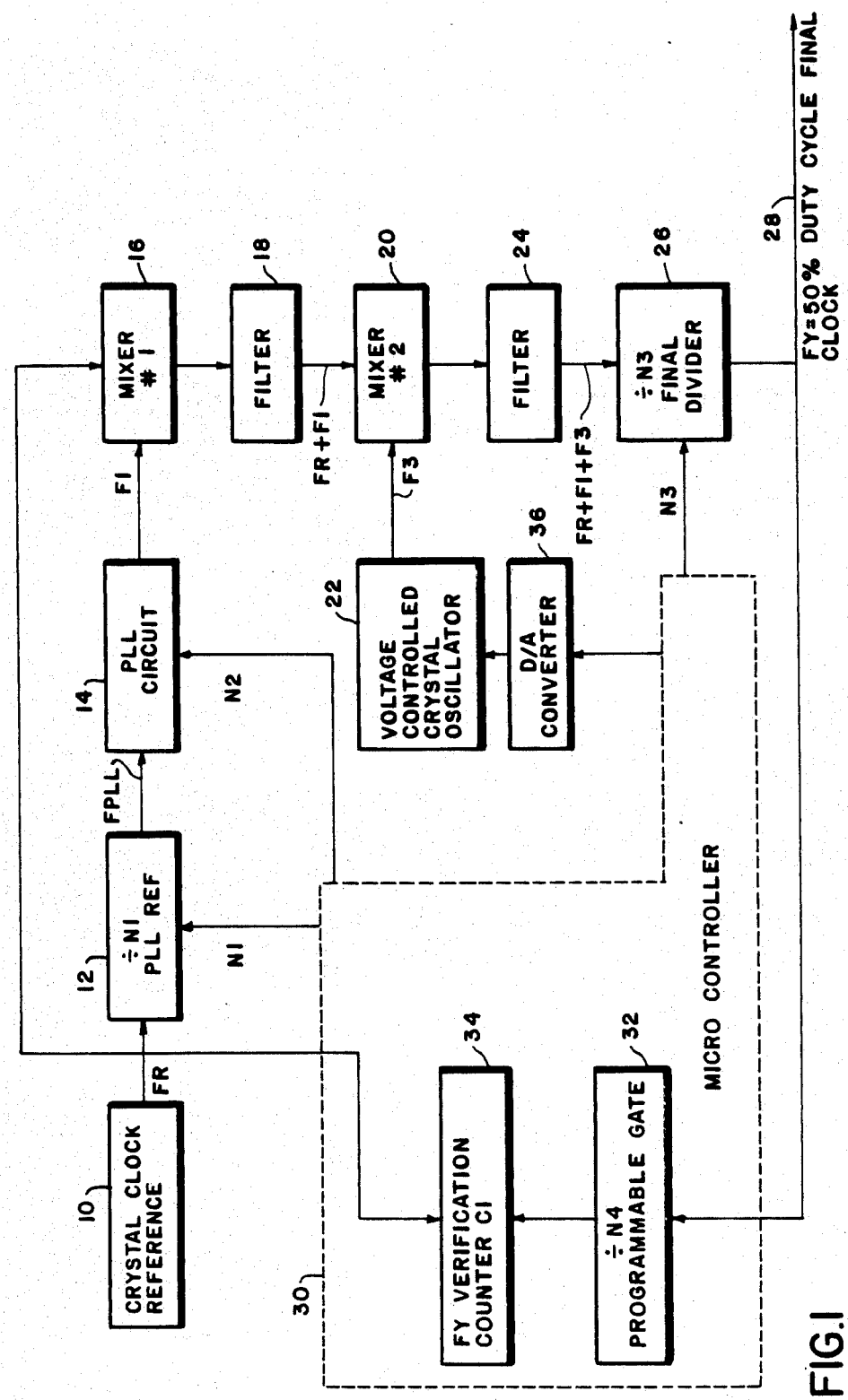
FIG. 1 is a block diagram of the frequency generator according to the present invention.

The frequency generator shown in FIG. 1 comprises a square wave generator 10 which uses a crystal controlled oscillator to produce a clock signal having a highly accurate and stable first reference frequency FR. This clock signal is passed to a frequency divider circuit 12 which divides the reference frequency FR by a number N1 to produce a clock signal with a frequency FPLL.

The clock signal of frequency FPLL is supplied to a digital phase locked loop circuit 14 of conventional design. Such a circuit, which is described in the aforementioned text *Frequency Synthesizers: Theory and Design* (pp. 31 and 32) comprises a voltage controlled oscillator, a frequency divider, a phase comparator and a low pass filter. The frequency of the VCO output is divided by a selected number N2 and the resulting frequency is compared with the reference frequency FPLL. An error voltage produced by the phase comparator is supplied through the low pass filter to the voltage input of the VCO to maintain the VCO on frequency and in phase. The frequency F1 of the VCO is therefore adjustable, within limits, by selecting the divider number N2.

For locking to occur:
F1 = N2 × FPLL
Since FPLL = FR/N1, then F1 = FR(N2/N1).

A typical value of the high accuracy reference frequency FR is 3 MHz. The first divider number N1 may then be set at 3,000 to produce a PLL reference frequency FPLL of 1 KHz. The phase locked loop parameters may then be set such that the lower output frequency F1 is 1 MHz when the second divider number N2 is set equal to 1,000, and the upper output frequency is 2 MHz when the number N2 is set to 2,000. This arrangement makes it possible to vary the frequency F1 between 1 MHz and 2 MHz in 1,000 Hz step increments.

The output of the PLL circuit 14 of frequency F1 is supplied, together with the clock reference signal of frequency FR, to a first mixer 16 which produces an output signal with frequencies FR±F1. One of the two sidebands is selected by passing the output of the mixer 16 through a bandpass filter 18. Depending upon the final frequency desired, the output of the filter 18 may have the frequency FR+F1 or FR−F1, the former frequency being selected here for illustration.

The output of the filter 18 is passed to a second mixer 20 which mixes this signal with a second reference signal F3 generated by a voltage controlled crystal oscillator 22.

The VCXO 22 typically operates to produce a clock signal with a frequency of approximately 20 MHz. The VCXO is capable of shifting its frequency by ±100 parts per million, hence providing the ability to vary its output frequency F3 by a total of ±2000 Hz in approximately 1 Hz steps.

The clock signal of frequency F3 is mixed, in mixer circuit 20, with that of frequency FR+F1 to produce a signal of frequency FR +F1±F3. Again, one of the two sidebands is selected by a bandpass filter 24 to produce, for example, a clock signal having a frequency of FR+F1+F3. This output may be used directly o passed through a final frequency divider circuit 26 which divides this frequency by a selectable third number N3 and produces an output clock signal on line 28 with a final frequency FY.

Provided that N3 is an even number, the final clock signal produced by the frequency divider 26 will have a 50% duty cycle and its frequency FY will be dependent upon the reference frequencies FR and F3 and the divider numbers N1, N2 and N3, as follows:

$$F1 = FR \ (N2/N1)$$

$$FR + F1 + F3 = FR \ (1 + N2/N1) + F3$$

$$FY = \frac{FR \ (1 + N2/N1) + F3}{N3}$$

In order to correct for deviation of the actual final frequency FY from the desired final frequency, which is manually set into a microcontroller 30 via a keyboard (not shown), the clock signal on line 28 is supplied to a microcontroller 30 where it i initially divided by a fourth and relatively large number N4 in a programmable gate 32. Each time that the microcontroller counts N4 cycles of the final clock signal, it reads and clears a verification counter 34 which continuously receives, as a count input, the first reference clock signal of frequency FR. The count C1 in the counter 34 that appears at the end of the counting period T1 is then compared with a desired count which would occur if the actual final frequency FY were equal to the selected, desired frequency. The difference between the actual count C1 and the desired count is used to adjust the number applied to a digital-to-analog converter 36 that supplies a control voltage to the VCXO 22.

Preferably, the divider number N4 is set to provide an error reading of one part per million. This would require that the count C1 at the end of the period T1 be equal to 1,000,000. Since FR is a fixed reference, for example at 3 MHz, we select N4 in accordance with the following:

$$1/T1 = FY_d/N4$$

$$T1 = N4/FY_d$$

$$C1 = FR \times T1 = FR \times N4/FY_d$$

$$N4 = C1 \times FY_d/FR.$$

where $FY_d$ is the desired final frequency.

Once N4 is known the actual final frequency $FY_a$ is given by:

$FY_a = FR \times N4/C1 \pm$ one FR clock period as maximum error.

The microcontroller 30 then finds the difference between the desired final frequency and the actual final frequency as an error EY.

$$EY = FY_d - FY_a.$$

The error value EY is then added to (or substracted from) the digital number supplied to the D/A converter 36 to adjust the second reference frequency F3.

In the example shown, where the VCXO 22 produces a frequency of 20 MHz±2,000, and a 12 bit binary digital-to-analog converter 36 is used to provide the analog signal for the VCXO. This 12 bit DAC thus provides an adjustment of the frequency F3 in 4096 substantially equal steps of approximately 1 Hz. Since each step changes the frequency by 1 Hz, a change in the amount of the error in frequency EY will change FY, and thus correct the error, by the same amount. Since N4 has been selected to make the maximum error one part per million, the actual final frequency will have an error of less than 1 Hz.

The phase and filter noise contributions of the phase locked loop are minimized in the circuit according to the present invention because the total contribution of the intermediate frequency F1 is less than 10% of the total frequency FR+F1+F3, even prior to dividing this total frequency by the third divider number N3. As a result, the circuit according to the invention provides a synthesized frequency output with a resolution of 1/N3 Hz and an accuracy found only in the finest laboratory equipment. For example, for a final frequency FY of 1 MHz the resolution is 1/24 Hz.

Figure 2:
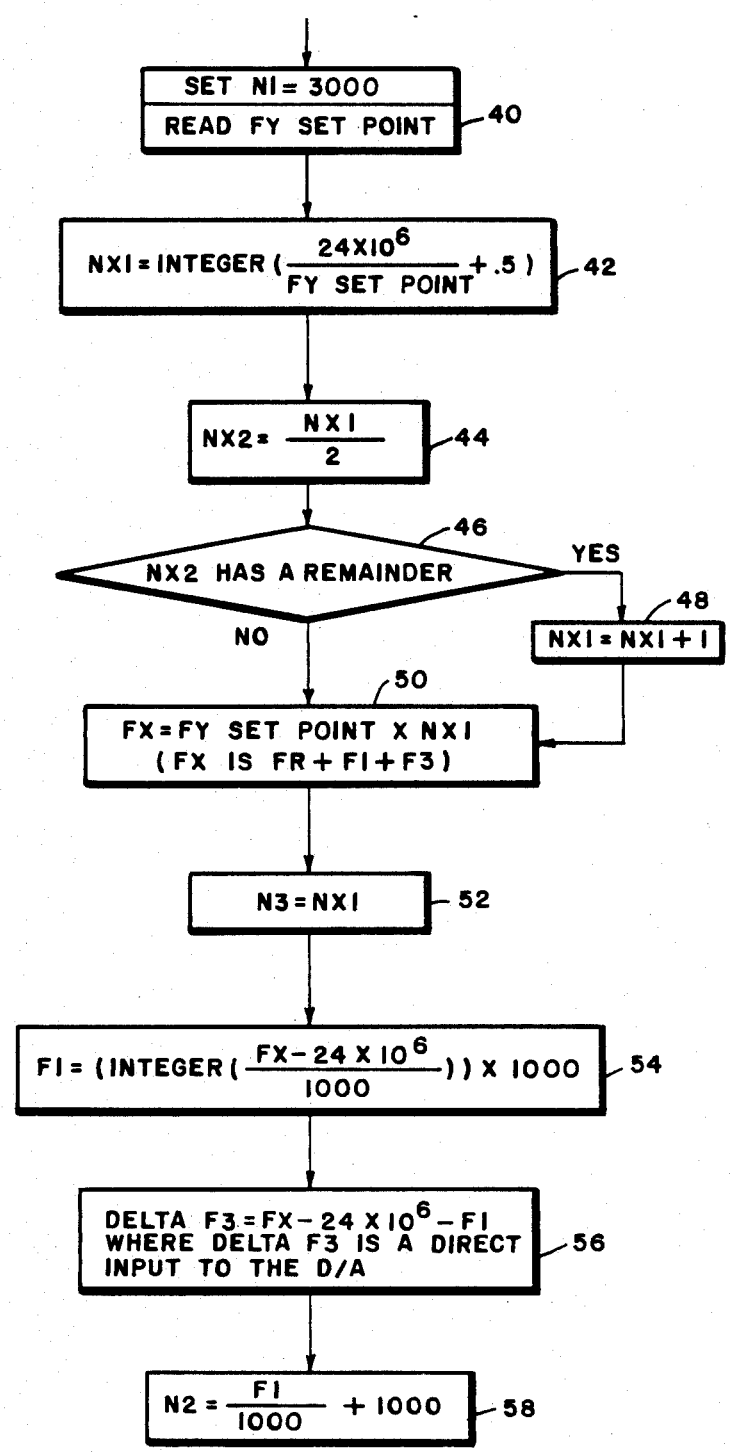
FIG. 2 is a flow chart illustrating the operation of the microcontroller employed in the frequency generator of FIG. 1. This flow chart shows the algorithm for selecting the numbers N1, N2 and N3 and the adjustment of a voltage controlled oscillator to obtain the desired output frequency.

The algorithm employed by the microcontroller 30 to select the numbers N1, N2 and N3 and to adjust the VCXO 22 to obtain the desired frequency is shown in FIG. 2.

The microcontroller program starts, at block 40, by selecting N1 to be 3,000 and by reading the desired frequency $FY_d$ from the controller input buffer. This desired frequency $FY_d$ is indicated as the "FY set point" in the flow chart.

The algorithm serves to determine the closest even number and the delta to be added or subtracted to give the desired final frequency $FY_d$ from the formula:

$$\frac{24 \text{ MHz} \pm \text{delta}}{FY_d} = \text{even number,}$$

where delta=N2×1000+remainder.

In block 42, a parameter NX1 is determined by dividing the desired frequency $FY_d$ into $24 \times 10^6$, adding 0.5 to the result, and then taking the integer portion (the numbers to the left of the decimal point). In blocks 44 and 46, it is determined whether the parameter NX1 is an even number. If not, the number 1 is added to in in block 48 to make it an even number.

In block 50, the parameter FX, which is defined as the frequency FR+F1+F3, is set equal to the desired frequency $FY_d$ times the parameter NX1. FX is therefore a number close to 25 MHz.

As a next step, in block 52, the number N3 is calculated. Thereafter, in block 54, the frequency F1, which is the total contribution of the phase locked loop, is calculated by taking the integer portion of:

$$\frac{FX - 24 \times 10^6}{100},$$

and multiplying by 1000.

Once F1 is known, it is possible to determine the number delta F3 to be applied to the D/A converter 36, in block 56, and also determine the number N2, in block 58. The number delta F3, which is the remainder that is less than 1,000, provides the fine adjustment of the VCXO 22. The number N2 provides the frequency adder by 1,000 in the phase locked loop circuit 14 with 1 MHz being the minimum frequency.

As an example, let us assume that the desired output frequency $FY_d$ is to be 255,999. This number is set into the microcontroller by the user via a keyboard. The microcontroller reads this number, divides it into $24 \times 10^6$ and adds 0.5. The result is 94.2503662123, the integer portion being 94. Since 94 is an even number, NX1 is allowed to remain equal to 94.

As a next step, FX is calculated by multiplying 255,999 by 94 to yield the product 24,063,906.

To obtain the course adjustment, F1 is calculated by subtracting $24 \times 10^6$ from FX (yielding 63,906), dividing by 1,000, taking the integer portion and multiplying by 1,000. F1 is therefore equal to 1063. The divider N2 is therefore equal to 63.

To obtain the fine adjustment, delta F3, F1 is subtracted from the difference $FX - 24 \times 10^6$ to obtain 906. The number 906 is therefore applied to the A/D converter 36.

The number N3 then becomes NX1.

Figure 3:
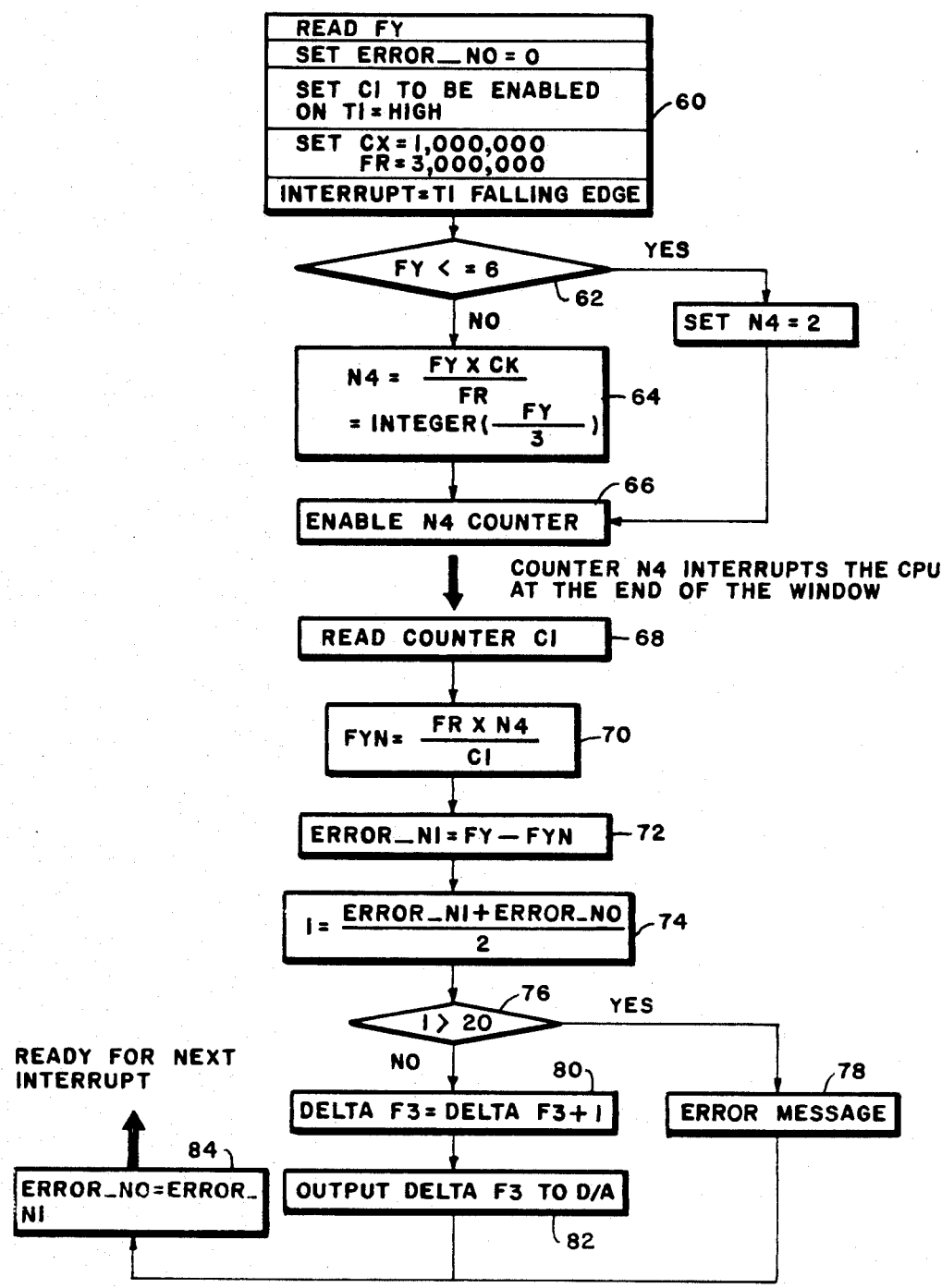
FIG. 3 is a second flow chart illustrating the operation of the microcontroller in FIG. 1. This flow chart shows the algorithm for error correction by adjustment of the voltage controlled crystal oscillator.

FIG. 3 shows the error correction routine used by the microcontroller 30. After initializing a number of parameters, in block 60, the microcontroller waits for an interrupt; namely, the end of the period T1. Assuming that the desired frequency $FY_d$ is greater than 6 Hz, in block 62, the divider number N4 is calculated as the integer portion of FY/3, in block 64. The programmable gate 32 (FIG. 1), or N4 counter 66, then interrupts the counter C1, at block 68, which has been counting the clock pulses at frequency FR.

The contents of the counter C1 are then used to determine the actual final frequency FYN, at block 70.

The actual frequency FYN is subtracted from the desired frequency FY to determine the current error EN1, at block 72.

As a next step, the average error for the last two periods is determined by adding the current error EN1 to the prior error EN0 and dividing by 2, in block 74. If this average error I is greater than 20, in block 76, an the error message is indicated to alert the operator, in block 78. If this average error is less than or equal to 20, the previous value of delta F3 is increased by the error I, in block 80, and the result is passed to the D/A converter 36, in block 82. If no error occurs, there is no change in delta F3.

Finally, the current error EN1 becomes the prior error EN0, in block 84, and the program waits for the next interrupt.

There has thus been shown and described a novel frequency generator which fulfills all the objects and advantages sought therefor. Many changes, modifications, variations and other uses and applications of the subject invention will, however, become apparent to those skilled in the art after considering this specification and the accompanying drawings which disclose the preferred embodiment thereof. All such changes, modifications, variations and other uses and applications which do not depart from the spirit and scope of the invention are deemed to be covered by the invention which is limited only by the claims which follow.

What is claimed is:

1. A method for generating a clock signal having an adjustable, accurate and stable frequency, said method comprising the steps of:
    (a) generating a clock signal with a first reference frequency (FR):
    (b) dividing said first reference frequency by a selectable first number (N2/N1) to produce a clock signal with a first intermediate frequency (F1), said first intermediate frequency thereby being coarsely adjustable in steps over a prescribed range;
    (c) mixing said clock signals having said first reference frequency and said first intermediate frequency to produce a clock signal having a second intermediate frequency (FR±F1);
    (d) generating a clock signal with a second reference frequency (F3), said second reference frequency being finely adjustable over a range in the order of magnitude of the frequency difference between two successive steps of said first intermediate frequency;

(e) mixing said clock signals having said second intermediate frequency (FR±F1) and said second reference frequency (F3) to produce a clock signal having a third intermediate frequency (FR±F1±F3).

2. The method recited in claim 1, further comprising the steps of comparing the actual frequency of a clock signal at least derived from said clock signal having said third intermediate frequency with a desired frequency so as to determine the error in frequency, and adjusting said second reference frequency to reduce said error.

3. The method recited in claim 2, wherein said step of comparing said actual frequency with said desired frequency includes the steps of counting the clock periods of said clock signal having said first reference frequency for a period of time which is dependent upon said actual frequency to produce a first count (C1) representative of said actual frequency, and comparing said first count with a second count representative of said desired frequency to determine said error.

4. The method recited in claim 1, wherein said first reference frequency is highly accurate and stable.

5. The method recited in claim 3, wherein said first reference frequency is highly accurate and stable.

6. The method recited in claim 1, further comprising the step of dividing said third intermediate frequency by a second number (N3) to produce a clock signal with an adjustable final frequency (FY).

7. The method recited in claim 2, further comprising the step of dividing said third intermediate frequency by a second number (N3) to produce a clock signal with an adjustable final frequency (FY), said final frequency being said actual frequency which is compared with said desired frequency to determine said error in frequency.

8. The method recited in claim 1, further comprising the step of filtering said clock signal having said second intermediate frequency to select one of the two sideband frequencies (FR+F1) and (FR−F1).

9. The method recited in claim 1, further comprising the step of filtering said clock signal having said third intermediate frequency to select one of the two sideband frequencies (FR±F1+F3) and (FR±F1−F3).

10. The method recited in claim 6, wherein said second number is an even integer and wherein said clock signal with said adjustable final frequency FY has a 50% duty cycle.

11. Apparatus for generating a clock signal having an adjustable, accurate, stable frequency, said apparatus comprising, in combination:

(a) first means for producing a clock signal with a first reference frequency (FR);

(b) second means, coupled to said first means, for producing a clock signal with an adjustable first intermediate frequency (F1), said first intermediate frequency being equal to said first reference frequency divided by a selectable first number (N2/N1) and thereby being coarsely adjustable in steps over a prescribed range;

(c) third means, coupled to said first and second means, for mixing said clock signals produced by said first and second means to produce a clock signal having a second intermediate frequency (FR±F1);

(d) fourth means for producing a clock signal with a second reference frequency (F3), said second reference frequency being finely adjustable over a range in the order of magnitude of the frequency difference between two successive steps of said first intermediate frequency;

(e) fifth means, coupled to said third and fourth means, for mixing said clock signals produced by said third and fourth means to produce a clock signal having a third intermediate frequency (FR±F1±F3).

12. The apparatus recited in claim 11, further comprising sixth means, coupled to said first and fifth means, for comparing the actual frequency of a clock signal at least derived from said clock signal having said third intermediate frequency with a desired frequency to produce a signal representing the error in frequency, and seventh means, coupled to said fourth and sixth means, for adjusting said second reference frequency in dependence upon said error signal so as to reduce the error between said actual frequency and said desired frequency.

13. The apparatus recited in claim 12, wherein said sixth means includes means for counting the clock periods of said clock signal having said first reference frequency for a period of time which is dependent upon said actual frequency to produce a first count (C1), representative of said actual frequency, and means, coupled to said counting means, for comparing said first count with a second count representative of said desired frequency.

14. The apparatus recited in claim 11, wherein said first means is a square wave generator comprising a crystal controlled oscillator.

15. The apparatus recited in claim 13, wherein said first means is a square wave generator comprising a crystal controlled oscillator.

16. The apparatus recited in claim 11, further comprising eighth means, coupled to said fifth means, for producing a clock signal with an adjustable final frequency (FY), said adjustable final frequency being equal to said third intermediate frequency divided by a second number (N3).

17. The apparatus recited in claim 12, further comprising eighth means, coupled to said fifth means, for producing a clock signal with an adjustable final frequency (FY), said adjustable final frequency being equal to said third intermediate frequency divided by a second number (N3), wherein said sixth means is coupled to said eighth means such that said final frequency is equal to said actual frequency which is compared with said desired frequency to produce said error signal.

18. The apparatus recited in claim 11, further comprising means, coupled to said third means, for filtering said clock signal with said second intermediate frequency to produce a clock signal having one of the two sideband frequencies (FR+F1) and (FR−F1).

19. The apparatus recited in claim 11, further comprising means, coupled to said fifth means, for filtering said clock signal with third intermediate frequency to produce a clock signal having one of the two sideband frequencies (FR±F1+F3) and (FR±F±−F3).

20. The apparatus recited in claim 16, wherein said second number is an even integer and wherein said clock signal with said adjustable final frequency FY has a 50% duty cycle.

21. The apparatus recited in claim 20, wherein said second means includes a phase locked loop circuit.

22. The apparatus recited in claim 11, wherein said fourth means is a square wave generator comprising a voltage controlled crystal oscillator.

23. The apparatus recited in claim 12, wherein said sixth means includes a programmed microcontroller.

24. The apparatus recited in claim 12, wherein said fourth means is a square wave generator comprising a voltage controlled crystal oscillator, and wherein said seventh means includes a digital-to-analog converter for producing a voltage, which is applied to said voltage controlled crystal oscillator, for varying said second reference frequency in dependence upon said error signal.

* * * * *